(12) United States Patent
Bu et al.

(10) Patent No.: US 10,586,834 B2
(45) Date of Patent: Mar. 10, 2020

(54) DISPLAY PANEL, METHOD FOR DRIVING THE SAME AND DISPLAY DEVICE

(71) Applicants: Beijing BOE Display Technology Co., Ltd., Beijing (CN); BOE Technology Group Co., Ltd., Beijing (CN)

(72) Inventors: Qianqian Bu, Beijing (CN); Weipin Hu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/174,692

(22) Filed: Oct. 30, 2018

(65) Prior Publication Data

US 2019/0214441 A1 Jul. 11, 2019

(30) Foreign Application Priority Data

Jan. 5, 2018 (CN) .......................... 2018 1 0010723

(51) Int. Cl.
  *G09G 3/3233* (2016.01)
  *H01L 27/32* (2006.01)
  (Continued)

(52) U.S. Cl.
  CPC ....... *H01L 27/3234* (2013.01); *G09G 3/3208* (2013.01); *G09G 3/3233* (2013.01);
  (Continued)

(58) Field of Classification Search
  CPC ........................................ G09G 3/3208–3291
  See application file for complete search history.

(56) References Cited

U.S. PATENT DOCUMENTS

2003/0025458 A1* 2/2003 Tuli ................ G09G 3/02
  315/169.3
2012/0187295 A1 7/2012 So et al.
  (Continued)

FOREIGN PATENT DOCUMENTS

CN 101246804 A 8/2008
CN 102906886 A 1/2013
CN 106205551 A 12/2016

OTHER PUBLICATIONS

Corresponding Chinese Application 201810010723.8 Office Action dated Aug. 28, 2019.

*Primary Examiner* — William Boddie
*Assistant Examiner* — Jeffrey Parker
(74) *Attorney, Agent, or Firm* — Arent Fox LLP; Michael Fainberg

(57) ABSTRACT

A display panel, a method for driving the same and a display device are provided. Each pixel element includes an infrared detector, a light-emitting element and a first control unit, the infrared detector includes a first electrode, an infrared-sensitive layer and a second electrode, and the light-emitting element includes a pixel circuit, a third electrode, a light-emitting function layer and a fourth electrode. The second electrode is electrically connected with the third electrode, the first electrode is connected with the fourth electrode through the first control unit, and the first control unit is configured to connect the first electrode with the fourth electrode in an infrared detection mode, and to disconnect the first electrode from the fourth electrode in a display mode.

9 Claims, 2 Drawing Sheets

(51) Int. Cl.
*H01L 51/52* (2006.01)
*H04N 5/33* (2006.01)
*G09G 3/3208* (2016.01)
*H01L 27/146* (2006.01)

(52) U.S. Cl.
CPC ...... *H01L 27/3246* (2013.01); *H01L 51/5271* (2013.01); *H04N 5/33* (2013.01); *G09G 2360/14* (2013.01); *H01L 27/14669* (2013.01)

(56) References Cited

U.S. PATENT DOCUMENTS

2016/0351166 A1* 12/2016 Chen .................. G09G 3/20
2017/0272694 A1* 9/2017 Chiang .............. H01J 31/123

\* cited by examiner

DISPLAY PANEL, METHOD FOR DRIVING THE SAME AND DISPLAY DEVICE

CROSS-REFERENCES TO RELATED APPLICATIONS

This application claims priority to Chinese patent application No. 201810010723.8 filed on Jan. 5, 2018, which is incorporated herein by reference in its entirety.

FIELD

The present disclosure relates to the field of display technologies, and particularly to a display panel, a method for driving the same and a display device.

BACKGROUND

In recent years, the infrared imaging technologies have been significantly applied in the medical, military, night vision, satellite, civil, and other fields. At present, the infrared focal plane imaging technology is the most mature infrared imaging technology, which includes an array of detectors including more than ten thousands of infrared detector elements, and a corresponding readout circuit, both are connected through soldering.

SUMMARY

In an aspect, an embodiment of the disclosure provides a display panel. The display panel includes a base substrate, and a plurality of pixel elements arranged on the base substrate, each of the pixel elements including an infrared detector, a light-emitting element, and a first control unit. The infrared detector includes a first electrode, an infrared-sensitive layer and a second electrode; the light-emitting element includes a pixel circuit, a third electrode, a light-emitting function layer and a fourth electrode; the second electrode is electrically connected with the third electrode; and the first electrode is connected with the fourth electrode through the first control unit, and the first control unit is configured to connect the first electrode with the fourth electrode in an infrared detection mode, and to disconnect the first electrode from the fourth electrode in a display mode.

In a possible implementation, in the display panel above according to the embodiment of the disclosure, the second electrode is a metal reflecting layer.

In a possible implementation, in the display panel above according to the embodiment of the disclosure, the second electrode is electrically connected with the third electrode in planar contact.

In a possible implementation, in the display panel above according to the embodiment of the disclosure, the third electrode is a transparent electrode.

In a possible implementation, in the display panel above according to the embodiment of the disclosure, a material of the third electrode includes at least one of $C_{60}$ or a carbon nanometer tube material.

In a possible implementation, in the display panel above according to the embodiment of the disclosure, the display panel further includes a pixel definition layer, and the light-emitting function layer is located in an opening area defined by the pixel definition layer.

In a possible implementation, in the display panel above according to the embodiment of the disclosure, a orthographic projection of a photosensitive area of the infrared-sensitive layer onto the base substrate covers a orthographic projection of the light-emitting function layer onto the base substrate.

In a possible implementation, in the display panel above according to the embodiment of the disclosure, the first electrode is a metal electrode, and a orthographic projection of the pixel definition layer onto the base substrate covers a orthographic projection of the first electrode onto the base substrate.

In a possible implementation, in the display panel above according to the embodiment of the disclosure, the light-emitting function layer includes a hole injection layer, a hole transport layer, a light-emitting layer, an electron transport layer, and an electron injection layer successively stacked on the third electrode.

In another aspect, an embodiment of the disclosure further provides a display device including the display panel above according to the embodiment of the disclosure.

In another aspect, an embodiment of the disclosure further provides a method for driving the display panel above. The method includes: in the infrared detection mode, controlling the first control unit to be closed to connect the first electrode with the fourth electrode; and in the display mode, controlling the first control unit to be opened to disconnect the first electrode from the fourth electrode.

In a possible implementation, in the driving method above according to the embodiment of the disclosure, the method further includes: in the infrared detection mode, applying a first voltage to the third electrode and the second electrode, and a second voltage to the fourth electrode and the first electrode, wherein the first voltage is higher than the second voltage, and a difference between the first voltage and the second voltage is below a threshold voltage for the light-emitting function layer to emit light.

DETAILED DESCRIPTION

Figure 1:
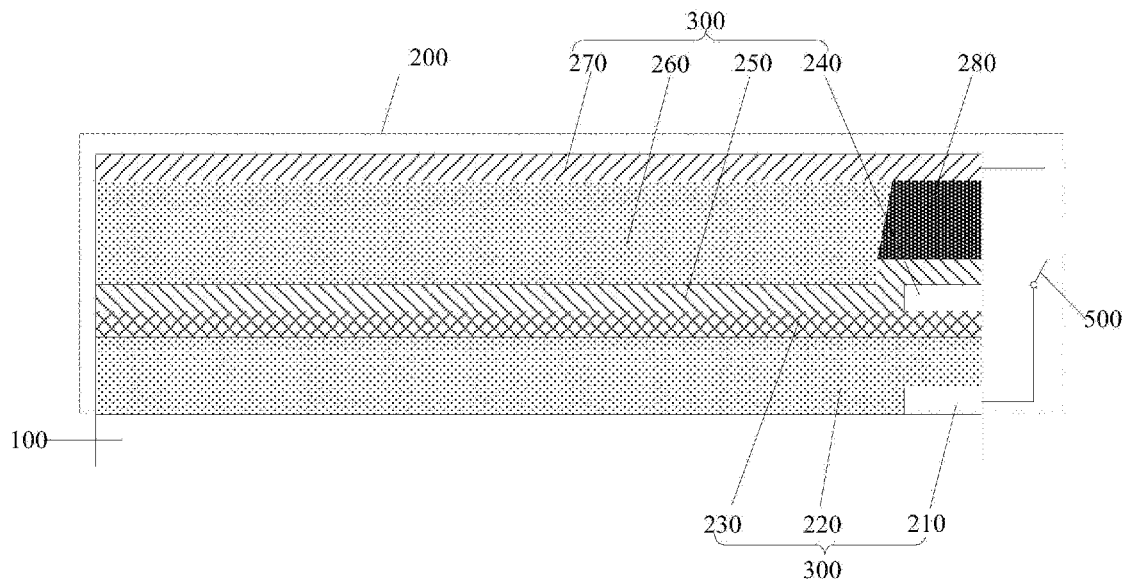
FIG. 1 is a schematic structural diagram of a display panel in an infrared detection mode according to an embodiment of the disclosure.

In the related art, the infrared focal plane imaging technology suffers from the following two problems: firstly the detectors shall be connected with the readout circuit using more than ten thousands of indium columns in a flip process, thus complicating the process, and degrading the reliability; and secondly a detected signal shall be read out by the readout circuit, and the process circuit is complex.

The embodiments of the disclosure provide a display panel, a method for driving the same and a display device, to at least partly address the problem in the related art of a complicated structure of an infrared imaging device.

Implementations of the display panel, the method for driving the same, and the display device according to the embodiments of the disclosure will be described below in details with reference to the drawings.

The shapes and sizes of respective components in the drawings are not intended to reflect any real proportion of the display panel, but only intended to illustrate the disclosure of the disclosure.

Figure 2:
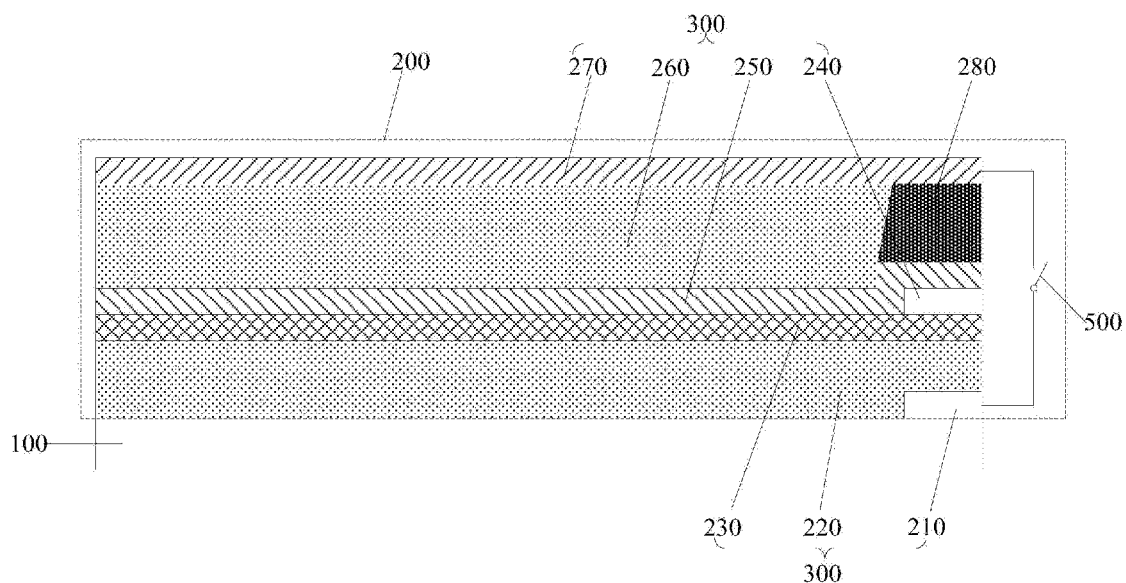
FIG. 2 is a schematic structural diagram of the display panel in a display mode according to the embodiment of the disclosure.

As illustrated in FIG. 1 and FIG. 2, a display panel according to an embodiment of the disclosure includes: a base substrate 100, and a plurality of pixel elements 200 arranged on the base substrate 100, each of the pixel elements 200 includes an infrared detector 300, a light-emitting element 400, and a first control unit 500.

The infrared detector 300 includes: a first electrode 210, an infrared-sensitive layer 220, and a second electrode 230.

The light-emitting element 400 includes: a pixel circuit 240, a third electrode 250, a light-emitting function layer 260 and a fourth electrode 270.

The second electrode 230 is electrically connected with the third electrode 250.

The first electrode 210 is connected with the fourth electrode 270 through the first control unit 500, and the first control unit 500 is configured to connect the first electrode 210 with the fourth electrode 270 in an infrared detection mode as illustrated in FIG. 1, and to disconnect the first electrode 210 from the fourth electrode 270 in a display mode as illustrated in FIG. 2.

Specifically in the display panel above according to the embodiment of the disclosure, the infrared detector 300 is coupled with the light-emitting element 400, so that a readout circuit can be omitted, and infrared light detected by the infrared detector 300 can be converted directly into visible light for displaying, but also the light-emitting element 400 can display an image normally. The display panel above according to the embodiment of the disclosure can be significantly applied to military, night vision, and other extreme conditions portably, conveniently and practically.

Specifically in the display panel above according to the embodiment of the disclosure, as illustrated in FIG. 1 and FIG. 2, the infrared detector 300 is generally located between the light-emitting element 400 and the base substrate 100. The first electrode 210 in the infrared detector 300 is generally arranged at the bottommost layer of the infrared detector 300, that is, in contact with the base substrate 100, and there is an ohm contact between the first electrode 210, which is the electrode of the infrared detector 300, and the infrared-sensitive layer 220. The second electrode 230 in the infrared detector 300 is generally arranged at the topmost layer of the infrared detector 300, that is, in contact with the light-emitting element 400, and there is an ohm contact between the second electrode 230, which is the electrode of the infrared detector 300, and the infrared-sensitive layer 220. The pixel circuit 240 in the light-emitting element 400 is generally at the bottommost layer of the light-emitting element 400, that is, in contact with the infrared detector 300, the third electrode 250 is electrically connected with the pixel circuit 240, and the light-emitting function layer 260 is arranged between the third electrode 250 and the fourth electrode 270.

Specifically in the infrared detection mode, as illustrated in FIG. 1, the first control unit 500 is closed to connect the first electrode 210 with the fourth electrode 270. Infrared light is incident on the bottom of the display panel, passes through the base substrate 100 and reaches the infrared-sensitive layer 220. The infrared light is absorbed by an intrinsic layer in the infrared-sensitive layer 220, thus resulting in photo-induced electrons and holes, where the holes flow upward, pass through the second electrode 230 and the third electrode 250, and are injected into the light-emitting function layer 260; and the electrons flow downward, pass through the first electrode 210 and the fourth electrode 270 of the light-emitting element 400, and are injected into the light-emitting function layer 260. The electrons are recombined with the holes at the light-emitting function layer 260 to emit light. Stated otherwise, the infrared detector 300 converts an infrared light signal into a light-current signal upon reception of the infrared light signal, and the light-current signal is injected into the light-emitting element 400 to enable the light-emitting element 400 to emit a corresponding visible light signal, and in this way, the infrared light is converted into the visible light.

Furthermore in the infrared detection mode, first voltage can be further applied to the third electrode 250 and the second electrode 230, and second voltage can be further applied to the fourth electrode 270 and the first electrode 210, where the first voltage is higher than the second voltage, and the difference between the first voltage and the second voltage is below a threshold voltage for the light-emitting function layer to emit light. Specifically the pixel circuit 240 can apply the first voltage to the third electrode 250 and the second electrode 230, or the pixel circuit 240 can be disabled, and the first voltage can be applied to the third electrode 250 and the second electrode 230 by a separate signal line, although the embodiment of the disclosure will not be limited thereto. In this way, the light-emitting element 400 can be positively biased, and the infrared detector 300 can be negatively biased, so that the photo-induced electrons and holes resulting from the intrinsic layer absorbing the light in the infrared-sensitive layer 220 can flow directionally toward each other, and be separated, due to the biasing to thereby lower the probability that the electrons and the holes are recombined at the infrared-sensitive layer 220, so as to improve the concentration of the directionally flowing holes, and the concentration of the directionally flowing electrons, thus facilitating the conversion of the infrared light into the visible light.

Specifically in the display mode, as illustrated in FIG. 1, the first control unit 500 is opened, and driving current is applied to the third electrode 250 of the light-emitting element 400 through the pixel circuit, so that when an external electric field above some threshold is applied, the holes and the electrons are injected into the light-emitting function layer 260 between the third electrode 250 and the fourth electrode 270 respectively from the third electrode 250 and the fourth electrode 270 in the form of current, combined into excitons, and radiated and recombined to emit light. The intensity of the emitted light is in direct proportion to the injected current, the current injected into each pixel element 200 can be controlled separately by the pixel circuit 240, and components displayed by the different pixel elements 200 driven by the driving current are synthesized into an image on the display panel, so that a display function is performed.

In some embodiments of the disclosure, in the display panel above, the second electrode 230 can be a metal reflecting layer.

Specifically when the second electrode 230 has a reflecting function, the light-emitting element 400 is a top-emitting OLED element, that is, the light-emitting element 400 emits the visible light from the upper side in FIG. 1 and FIG. 2; and correspondingly the infrared detector 300 receives the infrared light from the lower side in FIG. 1 and FIG. 2. The second electrode 230 with the reflecting function can reflect back such a part of the visible light emitted by the light-emitting element 400 in respective directions that exits the backside thereof so that the part of the visible light is emitted from the front side thereof to thereby improve the display luminance. Furthermore the second electrode 230 with the reflecting function can reflect the infrared light which is not fully absorbed by the infrared-sensitive layer 220 back to the infrared-sensitive layer 220 so that the infrared light is absorbed again to thereby improve the quantum efficiency of the infrared detector 300.

Specifically the material of the second electrode 230 with the reflecting function can be Ag and/or Al, where the thickness of Ag is generally at approximately 70 nm, and the thickness of Al is generally at approximately 200 nm.

Alternatively the second electrode 230 can be made of a transparent conductive material, and in this manner, the light-emitting element 400 can be a top-emitting OLED element, that is, the light-emitting element 400 emits the visible light from the upper side in FIG. 1 and FIG. 2; or the light-emitting element 400 can be a bottom-emitting OLED element, that is, the light-emitting element 400 emits visible light from the lower side in FIG. 1 and FIG. 2; or the light-emitting element 400 can be a bidirectionally emitting OLED element, that is, the light-emitting element 400 emits the visible light from both the upper side and the lower side in FIG. 1 and FIG. 2, although the embodiment of the disclosure will not be limited thereto. Correspondingly the infrared detector 300 can receive the infrared light from the lower side in FIG. 1 and FIG. 2, or the infrared detector 300 can receive the infrared light from the upper side in FIG. 1 and FIG. 2, or the infrared detector 300 can receive the infrared light rays from both the upper side and the lower side in FIG. 1 and FIG. 2, although the embodiment of the disclosure will not be limited thereto.

In some embodiments of the disclosure, in the display panel above, as illustrated in FIG. 1 and FIG. 2, the second electrode 230 and the third electrode 250 can be electrically connected with each other in planar contact, that is, the parts of both the second electrode 230 and the third electrode 250 outside the pixel circuit 240 are in contact, so that the contact area of the second electrode 230 with the third electrode 250 can be increased to thereby improve the speed at which the holes are transmitted between them.

In some embodiments of the disclosure, in the display panel above, the third electrode 250 can be a transparent electrode. Of course, the third electrode 250 can alternatively be a non-transparent electrode, although the embodiment of the disclosure will not be limited thereto.

In some embodiments of the disclosure, in the display panel above, the material of the third electrode 250 can include at least one of $C_{60}$ or a carbon nanometer tube material, or can include an ITO or IZO material. Specifically the third electrode 250 made of the $C_{60}$ or the carbon nanometer tube material can significantly lower turn-on voltage of the light-emitting element 400 to thereby facilitate injection of the holes.

In some embodiments of the disclosure, in the display panel above, as illustrated in FIG. 1 and FIG. 2, the display panel can further include a pixel definition layer 280, and the light-emitting function layer 260 is located in an opening area defined by the pixel definition layer 280.

Specifically the pixel definition layer 280 covers and shields a pattern of the pixel circuit 240 and patterns of signal lines connected with the pixel circuit 240, and the signal lines include scan lines, data lines, etc. The opening area defined by the pixel definition layer 280 is an opening area of the pixel element 200, and an area where a pattern of the pixel definition layer 280 is located is non-opening area of the pixel element 200. A pattern of the light-emitting function layer 260 is located in the opening area of the pixel element 200.

Figure 3:
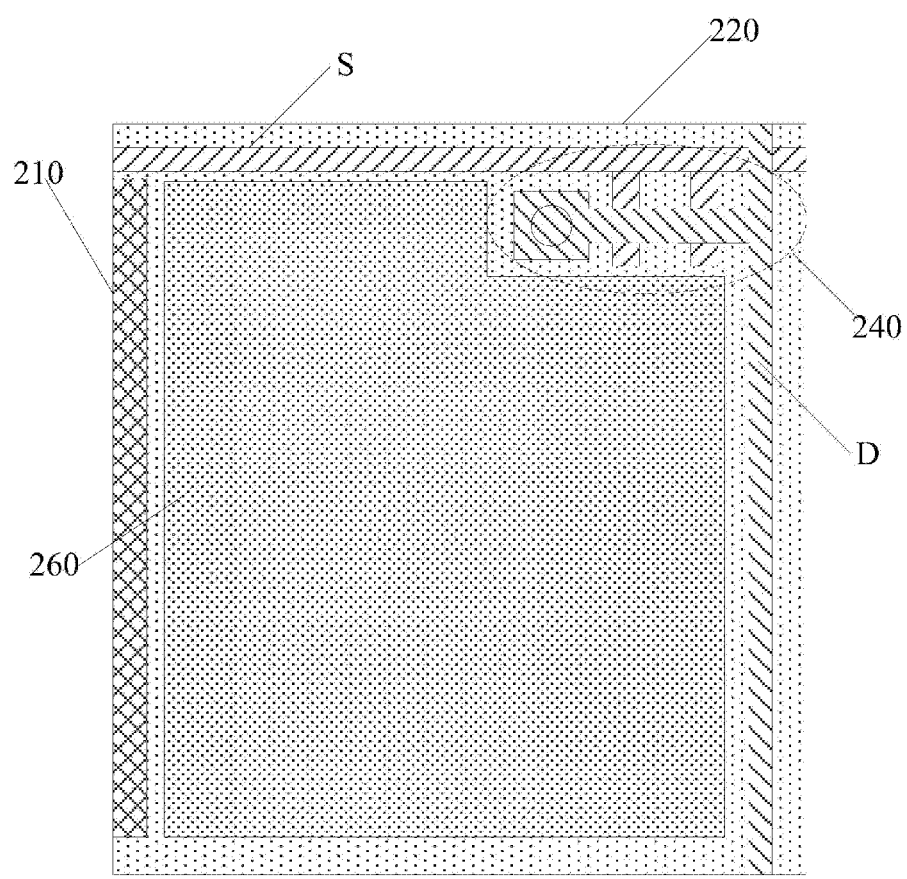
FIG. 3 is a top view of the display panel according to the embodiment of the disclosure.

In some embodiments of the disclosure, in the display panel above, as illustrated in FIG. 3, a orthographic projection of a photosensitive area of the infrared-sensitive layer 220 onto the base substrate 100 covers a orthographic projection of the light-emitting function layer 260 onto the base substrate. Generally the orthographic projection of the photosensitive area of the infrared-sensitive layer 220 onto the base substrate 100 completely overlies the orthographic projection of the light-emitting function layer 260 onto the base substrate.

In some embodiments of the disclosure, in the display panel above, as illustrated in FIG. 1 and FIG. 2, the first electrode 210 can be a metal electrode, and a orthographic projection of the pixel definition layer 280 onto the base substrate 100 covers a orthographic projection of the metal electrode onto the base substrate. Generally the orthographic projection of the pixel definition layer 280 onto the base substrate 100 fully covers the metal electrode onto the base substrate, that is, the metal electrode is located in non-opening area of the pixel element 200.

Specifically the material of the first electrode 210 can be Al and/or Mo, the thickness thereof is generally between 50 nm and 200 nm, and it can be formed through magnetically controllable spraying and growing. Furthermore in order to avoid the first electrode 210, through which no light can be transmitted, from hindering the infrared light from being received in the photosensitive area of the infrared-sensitive layer 220, the first electrode 210 shall be arranged in the non-opening area of the pixel element 200, i.e., in the area where the pattern of the pixel definition layer 280 is located. Specifically the entire layer of the first electrode 210 can be patterned in a photolithography process to form a desirable pattern of the first electrode 210.

In some embodiments, the material of the first electrode 210 can be a transparent metal oxide material, e.g., ITO, IZO, etc., and in this manner, the first electrode 210 can be arranged as a whole layer, or can be patterned, although the embodiment of the disclosure will not be limited thereto. The conductivity of a typical metal electrode is higher than a transparent metal oxide material, so the first electrode 210 may be a metal electrode.

Specifically as illustrated in FIG. 1 and FIG. 2, a orthographic projection of the first electrode 210 onto the base substrate 100 can particularly be arranged in the area covered by the pixel circuit 240, or can be arranged in another non-opening area, and as illustrated in FIG. 3, for example, the orthographic projection of the first electrode 210 onto the base substrate 100 doesn't overlap with the orthographic projections of the data line D, the scan line S, the pixel circuit 240, and the light-emitting function layer 260 onto the base substrate 100 to thereby alleviate signal interference.

In some embodiments of the disclosure, in the display panel above, the pixel circuit 240 generally includes a plurality of thin film transistors, and active layers of these thin film transistors can be made of amorphous silicon or low-temperature poly-silicon; and the thin film transistors can be structured with a top gate or a bottom gate, although the embodiment of the disclosure will not be limited thereto.

In some embodiments of the disclosure, in the display panel above, the infrared-sensitive layer 220 can be made of PbS, AlGaAs, Ge, or another inorganic material in a low-temperature process, or can be made of an organic polymer Polydimethylsiloxane (PDMS) or another organic infrared material.

In some embodiments of the disclosure, in the display panel above, the material of the fourth electrode 270 can be Ag and/or Mg, where the thickness of Ag is generally approximately 1 nm, and the thickness of mg is generally approximately 10 nm. The fourth electrode 270 is generally grown in a vacuum evaporation chamber.

In some embodiments of the disclosure, in the display panel above, the light-emitting element 400 can be an Organic Light-Emitting Diode (OLED), and in this manner, the light-emitting function layer 260 can include a hole injection layer, a hole transport layer, a light-emitting layer, an electron transport layer, and an electron injection layer successively stacked on the third electrode 250.

Specifically the layers included in the light-emitting function layer 260 are generally made of an organic material. Specifically the hole injection layer generally can be made of an organic material doped with CuPc, PTCD, $MnO_2$, or other transitional metal oxide. The hole transport layer generally can be made of NPB or TCTA. The particular material of the light-emitting layer can be determined according to a wavelength range of the visible light to be emitted, and particularly can be a blue light-emitting material, a red light-emitting material, a green light-emitting material, or a white light-emitting material. The electron transport layer generally can be made of Alq3 or BCP. The electron injection layer generally can be made of a LiF compound material.

In some embodiments of the disclosure, in the display panel above, the light-emitting element 400 can be a Quantum dot Light-Emitting Diode (QLED), and in this manner, the light-emitting function layer 260 can include a quantum dot light-emitting layer, although the embodiment of the disclosure will not be limited thereto.

Based upon the same inventive idea, an embodiment of the disclosure further provides a method for driving the display panel above, and since the method addresses the problem under a similar principle to the display panel above, reference can be made to the implementation of the display panel for an implementation of the method, and a repeated description thereof will be omitted here.

Specifically the method for driving the display panel above according to the embodiment of the disclosure includes the following steps.

As illustrated in FIG. 1, in the infrared detection mode, the first control unit 500 is controlled to be closed to connect the first electrode 210 with the fourth electrode 270.

As illustrated in FIG. 2, in the display mode, the first control unit is controlled to be opened to disconnect the first electrode from the fourth electrode.

In the infrared detection mode, the first control unit 500 is closed to connect the first electrode 210 with the fourth electrode 270. Infrared light is incident on the bottom of the display panel, passes through the base substrate 100 and reaches the infrared-sensitive layer 220, and the infrared light is absorbed by an intrinsic layer in the infrared-sensitive layer 220, thus resulting in photo-induced electrons and holes, where the holes flow upward and are injected into the light-emitting function layer 260 through the second electrode 230 and the third electrode 250; and the electrons flow downward, passes through the first electrode 210 and the fourth electrode 270 of the light-emitting element 400, and are injected into the light-emitting function layer 260, and the electrons are recombined with the holes at the light-emitting function layer 260 to emit light. Stated otherwise, the infrared detector 300 converts an infrared light signal into a light-current signal upon reception of the infrared light signal, and the light-current signal is injected into the light-emitting element 400 to enable the light-emitting element 400 to emit a corresponding visible light signal, and in this way, the infrared light is converted into the visible light.

In the display mode, the first control unit 500 is opened, and driving current is applied to the third electrode 250 of the light-emitting element 400 through the pixel circuit, so that the holes and the electrons are injected by an externally applied electric field above some threshold into the light-emitting function layer 260 between the third electrode 250 and the fourth electrode 270 respectively from the third electrode 250 and the fourth electrode 270 in the form of current, combined into excitons, and radiated and recombined to emit light. The intensity of the emitted light is in direct proportion to the injected current, the current injected into each pixel element 200 can be controlled separately by the pixel circuit 240, and components displayed by the different pixel elements 200 driven by the driving current are synthesized into an image on the display panel, so that a display function is performed.

In some embodiments of the disclosure, the driving method above can further include the following steps.

In the infrared detection mode, first voltage is applied to the third electrode 250 and the second electrode 230, and second voltage is applied to the fourth electrode 270 and the first electrode 210, where the first voltage is higher than the second voltage, and the difference between the first voltage and the second voltage is below a threshold voltage for the light-emitting function layer to emit light. Specifically the pixel circuit 240 can apply the first voltage to the third electrode 250 and the second electrode 230, or the pixel circuit 240 can be disabled, and the first voltage can be applied to the third electrode 250 and the second electrode 230 by a separate signal line, although the embodiment of the disclosure will not be limited thereto. In this way, the light-emitting element 400 can be positively biased, and the infrared detector 300 can be negatively biased, so that the photo-induced electrons and holes resulting from the intrinsic layer absorbing the light in the infrared-sensitive layer 220 can flow directionally toward each other, and be separated, due to the biasing to thereby lower the probability that the electrons and the holes are recombined at the infrared-sensitive layer 220, so as to improve the concentration of the directionally flowing holes, and the concentration of the directionally flowing electrons, thus facilitating the conversion of the infrared light into the visible light.

Based upon the same inventive idea, an embodiment of the disclosure further provides a display device including the display panel above according to the embodiment of the disclosure, and the display device can be a mobile phone, a tablet computer, a TV set, a display, a notebook computer, a digital photo frame, a navigator, or any other product or component with a display function. Reference can be made to the embodiment of the display panel above for an implementation of the display device, and a repeated description thereof will be omitted here.

In the display panel, the method for driving the same, and the display device according to the embodiments of the disclosure, each pixel element includes an infrared detector, a light-emitting element and a first control unit, the infrared detector includes a first electrode, an infrared-sensitive layer, and a second electrode, and the light-emitting element includes a pixel circuit, a third electrode, a light-emitting function layer, and a fourth electrode, where the second electrode is electrically connected with the third electrode, the first electrode is connected with the fourth electrode through the first control unit, and the first control unit is configured to connect the first electrode with the fourth electrode in an infrared detection mode, and to disconnect the first electrode from the fourth electrode in a display mode. The infrared detector is coupled with the light-emitting element so that a readout circuit can be omitted, and infrared light detected by the infrared detector can be converted directly into visible light for displaying an image, but also the light-emitting element can display an image normally.

Evidently those skilled in the art can make various modifications and variations to the disclosure without departing from the spirit and scope of this disclosure. Thus the disclosure is also intended to encompass these modifications and variations thereto so long as the modifications and variations come into the scope of the claims appended to the disclosure and their equivalents.

The invention claimed is:

1. A display panel, comprising:
   a base substrate; and
   a plurality of pixel elements arranged on the base substrate, each of the pixel elements comprising an infrared detector, a light-emitting element and a first control unit, wherein:
      the infrared detector comprises a first electrode, an infrared-sensitive layer and a second electrode;
      the light-emitting element comprises a pixel circuit, a third electrode, a light-emitting function layer and a fourth electrode;
      the second electrode is electrically connected with the third electrode; and
      the first electrode is connected with the fourth electrode through the first control unit, and the first control unit is configured to connect the first electrode with the fourth electrode in an infrared detection mode, and to disconnect the first electrode from the fourth electrode in a display mode; and
   a pixel definition layer, the light-emitting function layer being in an opening area defined by the pixel definition layer, wherein:
      an orthographic projection of a photosensitive area of the infrared-sensitive layer onto the base substrate covers an orthographic projection of the light-emitting function layer onto the base substrate, the first electrode is a metal electrode, and an orthographic projection of the pixel definition layer onto the base substrate covers an orthographic projection of the first electrode onto the base substrate;
      in the infrared detection mode, the infrared-sensitive layer is configured to receive an infrared light signal, and convert the infrared light signal into a light-current signal, the light-current signal being injected into the light-emitting function layer of the light-emitting element to enable the light-emitting element to emit a corresponding visible light signal, and
      in the display mode, the pixel circuit is configured to provide driving current to the third electrode of the light-emitting element to enable the light-emitting function layer of the light-emitting element to emit light.

2. The display panel according to claim 1, wherein the second electrode is a metal reflecting layer.

3. The display panel according to claim 1, wherein the second electrode is electrically connected with the third electrode in planar contact.

4. The display panel according to claim 1, wherein the third electrode is a transparent electrode.

5. The display panel according to claim 4, wherein a material of the third electrode comprises at least one of $C_{60}$ or a carbon nanometer tube material.

6. The display panel according to claim 1, wherein the light-emitting function layer comprises a hole injection layer, a hole transport layer, a light-emitting layer, an electron transport layer and an electron injection layer successively stacked on the third electrode.

7. A display device, comprising the display panel according to claim 1.

8. A method for driving the display panel according to claim 1, the method comprising:
   in the infrared detection mode, controlling the first control unit to be closed to connect the first electrode with the fourth electrode; and
   in the display mode, controlling the first control unit to be opened to disconnect the first electrode from the fourth electrode.

9. The method according to claim 8, further comprising:
   in the infrared detection mode, applying a first voltage to the third electrode and the second electrode, and a second voltage to the fourth electrode and the first electrode, wherein the first voltage is higher than the second voltage, and a difference between the first voltage and the second voltage is below a threshold voltage for the light-emitting function layer to emit light.

* * * * *